(12) United States Patent
Iisaka et al.

(10) Patent No.: US 10,362,719 B2
(45) Date of Patent: Jul. 23, 2019

(54) COMPONENT MOUNTING MACHINE

(71) Applicant: FUJI CORPORATION, Chiryu (JP)

(72) Inventors: Jun Iisaka, Nisshin (JP); Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 299 days.

(21) Appl. No.: 15/129,644

(22) PCT Filed: Apr. 2, 2014

(86) PCT No.: PCT/JP2014/059746
§ 371 (c)(1),
(2) Date: Sep. 27, 2016

(87) PCT Pub. No.: WO2015/151246
PCT Pub. Date: Oct. 8, 2015

(65) Prior Publication Data
US 2017/0156243 A1    Jun. 1, 2017

(51) Int. Cl.
*H05K 13/08*    (2006.01)
*H05K 13/04*    (2006.01)

(52) U.S. Cl.
CPC ....... *H05K 13/0408* (2013.01); *H05K 13/041* (2018.08); *H05K 13/0409* (2018.08); *H05K 13/08* (2013.01)

(58) Field of Classification Search
CPC ........... H05K 13/0408; H05K 13/0409; H05K 13/041; H05K 13/08
See application file for complete search history.

(56) References Cited

U.S. PATENT DOCUMENTS 5,336,935 A * 8/1994 Shitanda ............... B23P 19/001
                                                      29/407.04
6,041,494 A    3/2000 Mimura et al.
6,094,808 A * 8/2000 Mimura ............. H05K 13/0452
                                                      29/743

(Continued)

FOREIGN PATENT DOCUMENTS

CN    103429067 A    12/2013
EP    0 851 728 A1    7/1998

(Continued)

OTHER PUBLICATIONS

Extended European Search Report dated Feb. 22, 2017 in Patent Application No. 14887953.9.

(Continued)

*Primary Examiner* — Minh N Trinh
(74) *Attorney, Agent, or Firm* — Oblon, McClelland, Maier & Neustadt, L.L.P.

(57)    ABSTRACT

A component mounting machine including a head having two right and left nozzle holders to which suction nozzles are detachably attached, and a nozzle station having multiple sockets for accommodating the suction nozzles. The multiple sockets are arrayed at the same interval as an interval of the right and left nozzle holders. The suction nozzles mounted on the right and left adjacent nozzle holders can be simultaneously returned to right and left empty sockets, and the suction nozzles accommodated in the right and left adjacent sockets can be simultaneously mounted on the right and left nozzle holders.

3 Claims, 13 Drawing Sheets

(56) References Cited

U.S. PATENT DOCUMENTS

| | | | |
|---|---|---|---|
| 6,606,785 B1* | 8/2003 | Kadohata | H05K 13/0409 29/740 |
| 6,640,431 B1 | 11/2003 | Yoriki et al. | |
| 6,935,019 B2* | 8/2005 | Kadohata | H05K 13/0409 29/832 |
| 6,988,612 B1 | 1/2006 | Kabeshita et al. | |
| 8,646,174 B2* | 2/2014 | Kaida | H05K 13/0452 29/832 |
| 2002/0108239 A1* | 8/2002 | Isogai | H05K 13/0413 29/834 |
| 2005/0133346 A1 | 6/2005 | Kabeshita et al. | |
| 2005/0204553 A1 | 9/2005 | Kabeshita et al. | |
| 2013/0000114 A1 | 1/2013 | Kitagawa et al. | |
| 2017/0156243 A1* | 6/2017 | Iisaka | H05K 13/0408 |

FOREIGN PATENT DOCUMENTS

| | | |
|---|---|---|
| EP | 1 032 251 A2 | 8/2000 |
| EP | 1 185 156 A1 | 3/2002 |
| JP | 05-235536 A | 9/1993 |
| JP | 09-260893 A | 10/1997 |
| JP | 10-242697 A | 9/1998 |
| JP | 2000-244193 A | 9/2000 |
| JP | 2005-086151 A | 3/2005 |
| JP | 2010-010272 A | 1/2010 |
| JP | 2010-251450 A | 11/2010 |
| JP | 2012-151332 A | 8/2012 |
| JP | 5199947 B2 | 5/2013 |
| JP | 2014-056952 A | 3/2014 |

OTHER PUBLICATIONS

Japanese Office Action dated Oct. 24, 2017 in Patent Application No. 2016-511261.
Combined Office Action and Search Report dated Aug. 13, 2018 in Chinese Patent Application No. 201480077460.2 (with English language translation of Office Action and English translation of categories of cited documents) citing reference AO therein, 12 pages.
International Search Report dated Jun. 24, 2014 in PCT/JP2014/059746 filed Apr. 2, 2014.

* cited by examiner

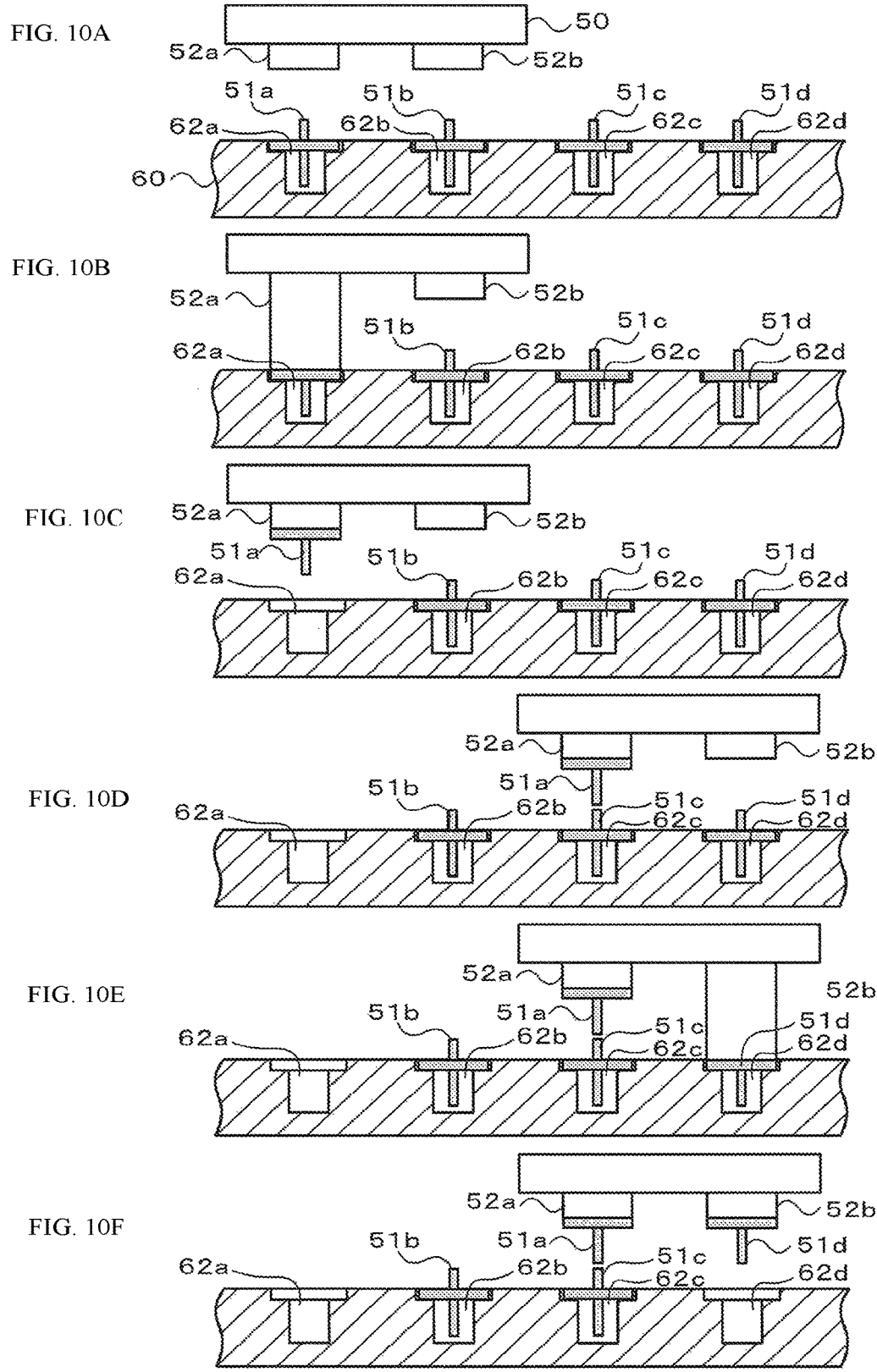

COMPONENT MOUNTING MACHINE

TECHNICAL FIELD

The present application relates to a component mounting machine which can cause a suction nozzle to pick up a component and to mount the component on a board.

BACKGROUND ART

In the related art, as this type of component mounting machine, there has been proposed a component mounting machine that includes multiple vertically movable heads (multiple holders) which have a detachable suction nozzle and which are independent of each other, and in which multiple components supplied from multiple component cassettes are simultaneously sucked and mounted on a board by the same number of suction nozzles (for example, refer to PTL 1).

PTL 1: JP-A-5-235536

DISCLOSURE

A component mounting machine needs to use a suction nozzle suitable for adsorption depending on a type (shape or size) of component. Accordingly, the component mounting machine normally includes a nozzle station in which multiple suction nozzles are previously accommodated, and carries out nozzle exchange work for exchanging the suction nozzles to be mounted on a holder if necessary. This nozzle exchange work is carried out through automatic exchange performed by moving a head in a horizontal direction (XY-axis direction) and moving the holder in a vertical direction (Z-axis direction). As types of component to be mounted on a board increase, the amount of required exchange work increases. Therefore, in some cases, production is stopped in order to carry out the exchange work of the suction nozzle, thereby resulting in poor production efficiency.

A main object of the present disclosure is to further improve production efficiency by providing a component mounting machine which can quickly carry out exchange work of a suction nozzle.

The present disclosure adopts the following device in order to achieve the above-described main object.

A gist of a component mounting machine according to the present disclosure is that the component mounting machine can cause a suction nozzle to pick up a component and to mount the component on a board, and the component mounting machine includes a head that has multiple holders to which the suction nozzle is detachably attached, moving device for enabling the head to move, lifting and lowering device for enabling the multiple holders to be independently lifted and lowered, a nozzle accommodation container having multiple accommodation sections that can accommodate the suction nozzle at the same interval as an interval of the multiple holders and that can accommodate multiple sets of combinations of the suction nozzles which can be simultaneously mounted on the multiple holders, nozzle exchange control device for enabling nozzle accommodation control in which the moving device is controlled so that the suction nozzles mounted on the multiple holders respectively move to a position facing an accommodation target accommodation section in the multiple accommodation sections, and in which the lifting and lowering device is controlled so that the suction nozzles mounted on the multiple holders are respectively and simultaneously accommodated in the facing accommodation target accommodation section, and for enabling nozzle mounting control in which the moving device is controlled so that the multiple holders having no suction nozzle mounted thereon move to a position facing the accommodation section which accommodates a set of mounting target suction nozzles in the multiple accommodation sections, and in which the lifting and lowering device is controlled so that the mounting target suction nozzles accommodated in the facing accommodation section are respectively and simultaneously mounted on the multiple holders, and nozzle replacement control device for performing nozzle replacement control in which the moving device is controlled so that any predetermined holder of the multiple holders moves to a position facing the accommodation section serving as a replacement origin in a case of satisfying a predetermined replacement condition under which the suction nozzle accommodated in the accommodation section serving as the replacement origin in the multiple accommodation sections is accommodated in the accommodation section serving as a replacement destination, in which the lifting and lowering device is controlled so that the opposing suction nozzle accommodated in the accommodation section serving as the replacement origin is mounted on the predetermined holder, in which the moving device is controlled so that the suction nozzle mounted on the predetermined holder moves to a position facing the accommodation section serving as the replacement destination, and in which the lifting and lowering device is controlled so that the suction nozzle mounted on the predetermined holder is accommodated in the accommodation section serving as the replacement destination.

This component mounting machine according to the present disclosure includes the head that has the multiple holders to which the suction nozzle is detachably attached, the moving device for enabling the head to move, the lifting and lowering device for enabling the multiple holders to be independently lifted and lowered, the nozzle accommodation container having the multiple accommodation sections that can accommodate the suction nozzle at the same interval as the interval of the multiple holders and that can accommodate the multiple sets of combinations of the suction nozzles which can be simultaneously mounted on the multiple holders, and the nozzle exchange control device. The nozzle exchange control device performs the nozzle accommodation control in which the suction nozzles mounted on the multiple holders are respectively moved to the positions facing the accommodation sections serving as the accommodation destination so that the suction nozzles mounted on the multiple holders are simultaneously accommodated in the facing accommodation sections, and performs the nozzle mounting control in which the multiple holders having no suction nozzle mounted thereon are respectively moved to the positions facing the accommodation sections accommodating the sets of the mounting target suction nozzles so that the mounting target suction nozzles accommodated in the respectively facing accommodation sections are simultaneously mounted on the multiple holders. In this manner, compared to a case where the suction nozzle exchange work is individually carried out for each of the holders, it is possible to improve efficiency of the exchange work. In addition, the nozzle replacement control device performs the nozzle replacement control in which the predetermined holder is moved to the position facing the accommodation section serving as the replacement origin, in which the suction nozzle accommodated in the facing accommodation section serving as the replacement origin is mounted on the predetermined holder, in which the suction nozzle mounted on the predetermined holder is moved to the position facing the accommodation section serving as the replacement destination, and in which the suction nozzle mounted on the predetermined holder is accommodated in the accommodation section serving as the replacement destination. That is, the nozzle replacement control can automatically change the combination of the suction nozzles which can be simultaneously mounted on the multiple holders, if necessary. As a result, the suction nozzle exchange work can be efficiently carried out, and it is possible to prevent poor production efficiency.

This component mounting machine according to the present disclosure may further include abnormality determination device for determining abnormality of the suction nozzle. The nozzle replacement control means may be device for perform the nozzle replacement control so that a spare suction nozzle accommodated in the accommodation section serving as the replacement origin is accommodated in the accommodation section serving as the replacement destination which is the accommodation destination of the suction nozzle determined as abnormal, on the basis that the replacement condition is satisfied in a case where the abnormality determination device determines that the suction nozzle is abnormal. In this case, the abnormal suction nozzle can be automatically replaced with the spare suction nozzle. Accordingly, even in a case where the suction nozzle is abnormal, it is possible to prevent poor production efficiency.

In addition, the component mounting machine according to the present disclosure may further include a first lane and a second lane which convey the board. The component mounting machine can simultaneously mount the component on the board conveyed to the first lane and mount the component on the board conveyed to the second lane. The nozzle replacement control device may be device for performing the nozzle replacement control so that a set of the suction nozzles used for the subsequent production is accommodated in the accommodation section serving as the replacement destination in which a set of the suction nozzles used for the other production is accommodated, on the basis that the replacement condition is satisfied in a case where anyone of the first lane and the second lane is under production and setup change for the subsequent production type is performed after the other production is completed. In this case, while the production in one lane is continuously performed, the setup change can be automatically performed for the subsequent production type in the other lane.

Furthermore, in the component mounting machine according to the present disclosure, the nozzle replacement control device may perform the nozzle replacement control during a free time until the subsequent board is conveyed after the component is completely mounted on the board and the board is returned. In this case, the nozzle replacement control can be performed without stopping the production.

In addition, in the component mounting machine according to the present disclosure, through a state where the suction nozzle accommodated in the accommodation section serving as the replacement origin and the suction nozzle accommodated in the accommodation section serving as the replacement destination are simultaneously mounted on the multiple holders, the nozzle replacement control device may replace the accommodation destinations of both the suction nozzles with each other. In this case, even in a state where the accommodation section of the nozzle accommodation container is not empty, the multiple suction nozzles can be replaced. In addition, the suction nozzle replacement can be quickly performed.

BRIEF DESCRIPTION OF DRAWINGS

FIG. 10 is a view for describing a nozzle replacement state (first half).

DESCRIPTION OF EMBODIMENTS

Next, a form for embodying the present disclosure will be described.

Figure 1:
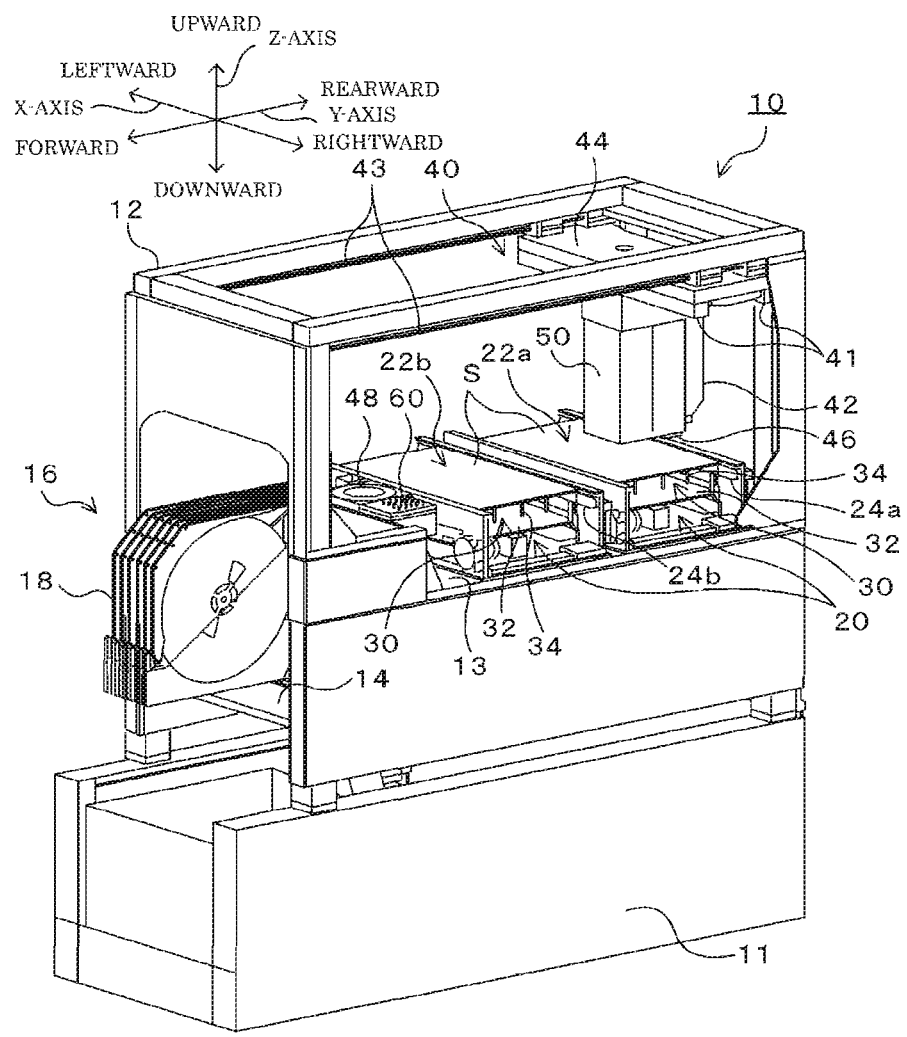
FIG. 1 is a configuration diagram illustrating a schematic configuration of a component mounting machine 10 according to the present embodiment.
Figure 2:
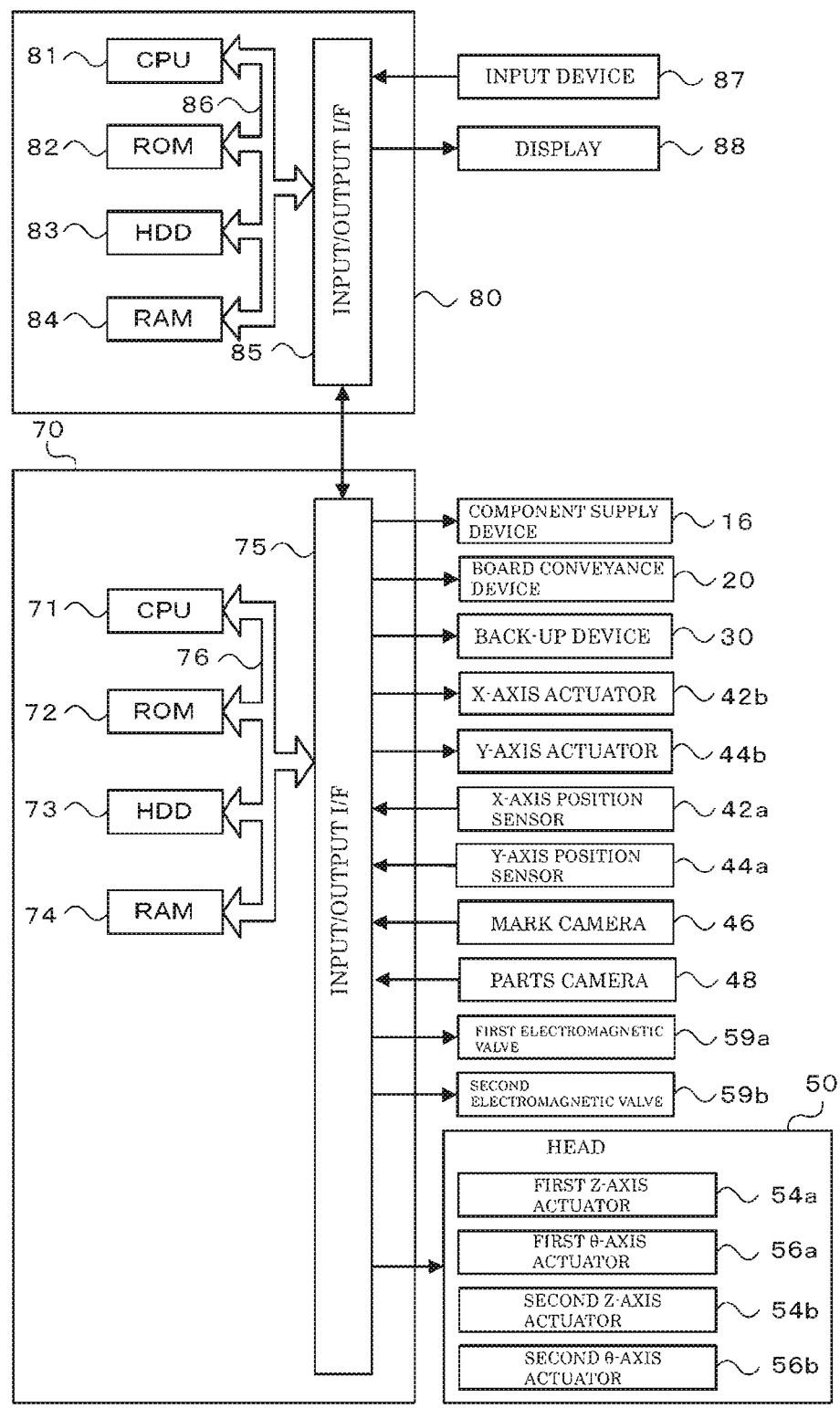
FIG. 2 is a block diagram illustrating an electrical connection relationship between a control device 70 and a management device 80 in the component mounting machine 10 according to the present embodiment.
Figure 3:
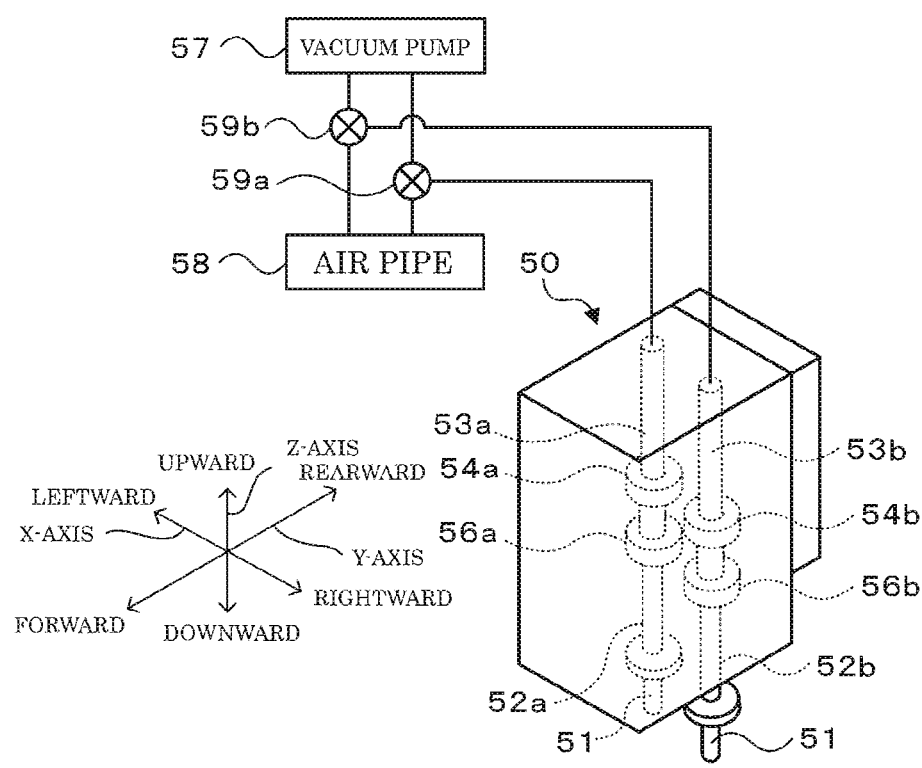
FIG. 3 is a configuration diagram illustrating a schematic configuration of a head 50.

FIG. 1 is a configuration diagram illustrating a schematic configuration of a component mounting machine 10 according to an embodiment of the present disclosure. FIG. 2 is a block diagram illustrating details of an electrical connection relationship between a control device 70 and a management device in the component mounting machine 10. FIG. 3 is a configuration diagram illustrating a schematic configuration of a head 50. A lateral direction in FIG. 1 represents an X-axis direction, a longitudinal direction represents a Y-axis direction, and a vertical direction represents a Z-axis direction.

According to the present embodiment, the component mounting machine 10 is suitable to mount a relatively large component or a different-shaped component. As illustrated in FIG. 1, the component mounting machine 10 includes a component supply device 16 which supplies a component P, aboard conveyance device 20 which conveys a board S, a back-up device 30 which backs up the board S conveyed by the board conveyance device 20 from a rear surface side, a head 50 on which two suction nozzles 51 (refer to FIG. 3) having various sizes (nozzle diameters) can be mounted and which causes the suction nozzles 51 to pick up and mount the component P on the board S, an XY robot 40 which moves the head 50 in an XY direction, a mark camera 46 which can image a positioning fiducial mark disposed in the board S, a parts camera 48 which can image the component sucked by the suction nozzle 51, a nozzle station 60 which stocks the multiple suction nozzles 51, and a control device 70 (refer to FIG. 2) which controls the overall component mounting machine. The board conveyance device 20, the back-up device 30, the head 50, and the XY robot 40 are accommodated inside a main body frame 12 installed on a base 11.

The component supply device 16 includes feeders 18 arrayed and arranged on a feeder table 14 formed on a front surface of the main body frame 12 so as to be juxtaposed in the lateral direction (X-axis direction). The feeder 18 is a tape feeder which feeds out a carrier tape having the component P accommodated at a predetermined pitch to a component supply position where the suction nozzle 51 can pick up the component. Although not illustrated, the carrier tape is configured to include a bottom tape having a cavity (recessed portion) formed at a predetermined pitch and a top film covering the bottom tape in a state where the component P is accommodated in each cavity. The feeder 18 pulls out the carrier tape wound around a reel, feeds the carrier tape to the component supply position, and detaches the top film from the bottom tape in front of the component supply position, thereby bringing the component P into an exposed state, that is, a pick-up available state, at the component supply position. FIG. 1 illustrates only the tape feeder as the component supply device 16. However, as the component supply device 16, a tray feeder can also be installed. The tray feeder supplies the component together with each tray while trays on which plate-shaped component to be mounted on the board S are juxtaposed are accommodated in a stage stacked state where the trays are stacked in multiple stages.

As illustrated in FIG. 1, the board conveyance device 20 is configured to function as a dual lane-type conveyance device in which two board conveyance paths such as a first lane 22a and a second lane 22b, and is arranged on a support table 13 disposed in a middle stage of the main body frame 12. Each board conveyance path includes belt conveyor devices 24a and 24b. The belt conveyor devices 24a and 24b are driven, thereby conveying the board S from the left to the right (board conveyance direction) in FIG. 1.

The back-up device 30 includes a back-up plate 32 which is installed so that the back-up plate 32 can be lifted and lowered by a lifting and lowering device (not illustrated) and multiple back-up pins 34 which are erected on the back-up plate 32. The back-up device 30 backs up the board S from a rear surface side by lifting up the back-up plate 32 in a state where the board S is conveyed to above the back-up plate 32 by the board conveyance device 20.

As illustrated in FIG. 1, the XY robot 40 includes a Y-axis guide rail 43 which is disposed along the Y-axis direction in an upper stage of the main body frame 12, a Y-axis slider 44 which is movable along the Y-axis guide rail 43, an X-axis guide rail 41 which is disposed along the X-axis direction on a lower surface of the Y-axis slider 44, and an X-axis slider 42 which is movable along the X-axis guide rail 41. The above-described mark camera 46 is attached to the lower surface of the X-axis slider 42.

As illustrated in FIG. 3, the head 50 includes a first nozzle holder 52a which detachably holds the suction nozzle 51 by using a nozzle chuck (not illustrated) serving as an axial member extending in the Z-axis direction, a second nozzle holder 52b which detachably holds the suction nozzle 51 by using a nozzle chuck (not illustrated) serving as an axial member similarly extending in the Z-axis direction arrayed and arranged so as to be juxtaposed with the first nozzle holder 52a in the lateral direction (X-axis direction), a first Z-axis actuator 54a which moves the first nozzle holder 52a in the vertical direction (Z-axis direction), a second Z-axis actuator 54b which moves the second nozzle holder 52b in the vertical direction (Z-axis direction), a first θ-axis actuator 56a which rotates the first nozzle holder 52a around the axis, and a second θ-axis actuator 56b which rotates the second nozzle holder 52b around the axis. Since the head 50 includes the Z-axis actuators 54a and 54b for each of the nozzle holders 52a and 52b, and the θ-axis actuators 56a and 56b, the head 50 can independently move the respective nozzle holders 52a and 52b in the Z-axis direction and the θ-axis direction (rotational direction). The respective nozzle holders 52a and 52b have internal passages 53a and 53b which communicate with a suction port of the respectively mounted suction nozzles 51. The internal passages 53a and 53b are adapted to selectively communicate with any one of a vacuum pump 57 and an air pipe via respectively corresponding electromagnetic valves (first electromagnetic valve 59a and second electromagnetic valve 59b). Therefore, in a case where the first electromagnetic valve 59a is driven so that the internal passage 53a of the first nozzle holder 52a and the vacuum pump 57 communicate with each other, negative pressure is applied to the suction port of the suction nozzle 51 mounted on the first nozzle holder 52a, thereby enabling the component P to be sucked. In addition, in a case where the first electromagnetic valve 59a is driven so that the internal passage 53a of the first nozzle holder 52a and the air pipe 58 communicate with each other, positive pressure is applied to the suction port of the suction nozzle 51 mounted on the first nozzle holder 52a, thereby enabling the component P to be released from adsorption. Similarly, in a case where the second electromagnetic valve 59b is driven so that the internal passage 53b of the second nozzle holder 52b and the vacuum pump 57 communicate with each other, negative pressure is applied to the suction port of the suction nozzle 51 mounted on the second nozzle holder 52b, thereby enabling the component P to be sucked. In addition, in a case where the second electromagnetic valve 59b is driven so that the internal passage 53b of the second nozzle holder 52b and the air pipe 58 communicate with each other, positive pressure is applied to the suction port of the suction nozzle 51 mounted on the second nozzle holder 52b, thereby enabling the component P to be released from adsorption.

In addition, the two right and left nozzle holders 52a and 52b are arranged at substantially the same interval as an interval of the respective component supply positions of the two right and left adjacent feeders 18. Therefore, the suction nozzle 51 is mounted on the two respective nozzle holders 52a and 52b, and the head 50 is moved so as to arrive at a position facing the respective component supply positions of the two feeders 18 to which the two mounted suction nozzles 51 are mounted. The two suction nozzles 51 are lowered, and the negative pressure is applied to the suction port of the suction nozzles 51. In this manner, the components P can be simultaneously sucked by the two suction nozzles 51.

Figure 4:
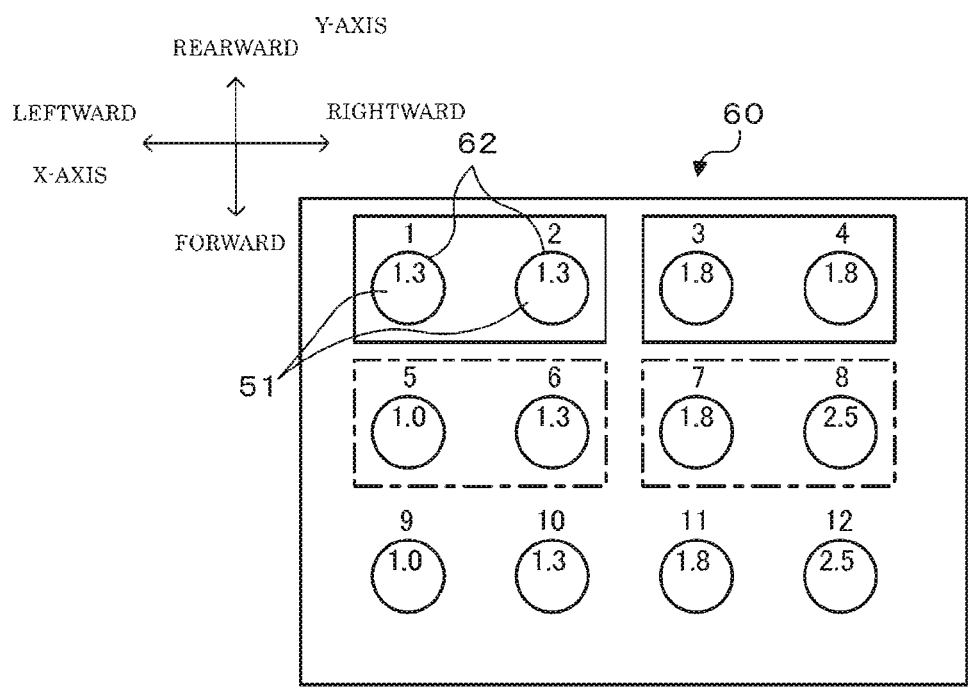
FIG. 4 is a view for describing an arrangement of each socket 62 of a nozzle station 60.

The nozzle station 60 includes multiple sockets 62 which can accommodate the suction nozzles 51 having different types (nozzle diameters). FIG. 4 is a view for describing an arrangement of each socket 62 of the nozzle station 60. The numbers illustrated above the respective sockets 62 in the drawing represent socket numbers, and the numbers illustrated inside the respective suction nozzles 51 (in circles) represents nozzle diameters (mm). This point is similarly applied to FIGS. 9 and 13 (to be described later). In the multiple sockets 62, an interval between the right and left adjacent sockets is substantially the same as an interval of the above-described two right and left nozzle holders 52a and 52b. Therefore, the head 50 is moved so that the two nozzle holders 52a and 52b, to which the suction nozzles 51 are mounted, arrive at positions respectively facing the two right and left adjacent empty sockets 62 in the multiple sockets 62. The two nozzle holders 52a and 52b are lowered, and the suction nozzles 51 held by the nozzle holders 52a and 52b are released. In this manner, the suction nozzles 51 mounted on the two nozzle holders 52a and 52b can be simultaneously returned to the two sockets 62 (simultaneous returning). In addition, the head 50 is moved so that the two nozzle holders 52a and 52b arrive at positions facing the two sockets 62 accommodating the suction nozzles 51. The two nozzle holders 52a and 52b are lowered, and the suction nozzles 51 accommodated in the two sockets 62 are held by the two nozzle holders 52a and 52b. In this manner, the two suction nozzles 51 can be simultaneously mounted on the two nozzle holders 52a and 52b (simultaneous mounting). The simultaneous returning and the simultaneous mounting are collectively referred to as simultaneous exchange. According to the present embodiment, in order to realize this simultaneous exchange, the management device 80 determines an arrangement position of the respective suction nozzles 51 on the nozzle station 60 in accordance with a production plan (to be described later). An instruction screen is output to and displayed on a display 88 so that a worker sets the suction nozzles 51 in accordance with the determined arrangement position. An identification code (not illustrated) is provided for the suction nozzle 51 at a visible position (upper surface of a flange portion of the suction nozzle 51) in a state where the suction nozzle 51 is accommodated in the socket 62. The control device 70 causes the mark camera 46 to image the identification code. In this manner, it is possible to specify all types of the suction nozzles 51 accommodated in the nozzle station 60.

The control device 70 is configured to function as a microprocessor mainly having a CPU 71, and includes a ROM 72, an HDD 73, a RAM 74, and an input and output interface 75 in addition to the CPU 71. These are electrically connected to each other via a bus 76. A position signal from an X-axis position sensor 42a for detecting a position of the X-axis slider 42, a position signal from a Y-axis position sensor 44a for detecting a position of the Y-axis slider 44, an image signal from the mark camera 46, and an image signal from the parts camera 48 are input to the control device 70 via the input and output interface 75. On the other hand, the control device 70 outputs a control signal to the component supply device 16, a control signal to the board conveyance device 20, a control signal to the back-up device 30, a drive signal to the X-axis actuator 42b for moving the X-axis slider 42, a drive signal to the Y-axis actuator 44b for moving the Y-axis slider 44, a control signal to the head 50 (drive signal to the first Z-axis actuator 54a, the second Z-axis actuator 54b, the first θ-axis actuator 56a, and the second θ-axis actuator 56b), a drive signal to the electromagnetic valves (the first electromagnetic valve 59a and the second electromagnetic valve 59b), via the input and output interface 75. In addition, the control device 70 is connected to the management device 80 via a communication network so as to be capable of bidirectional communication, and both of these exchange data and control signals with each other.

Figure 5:
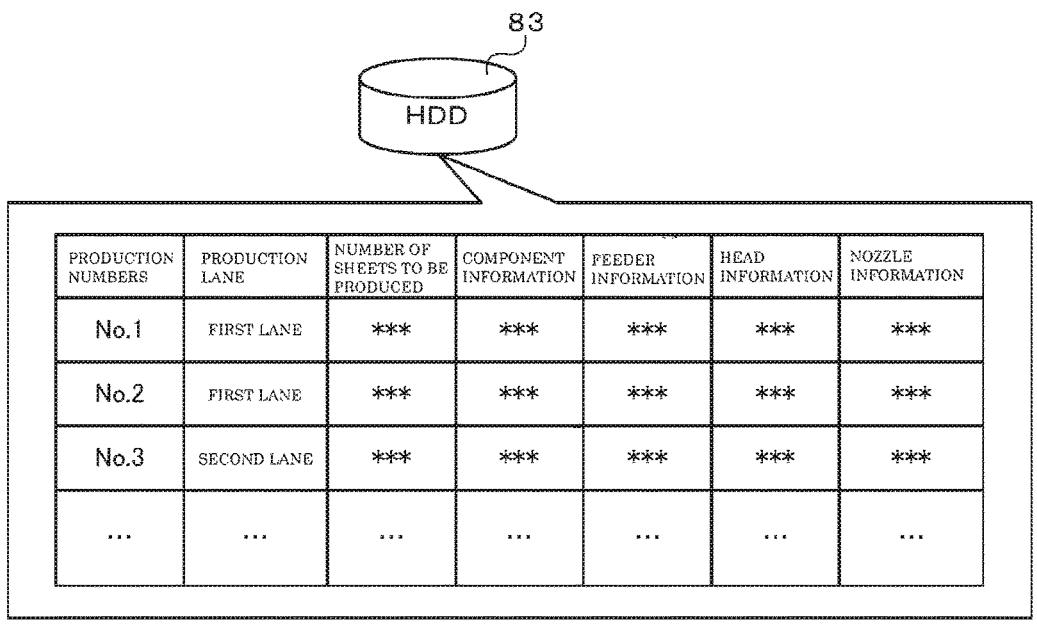
FIG. 5 is a view for describing an example of a production plan stored in a HDD 83 of the management device 80.

For example, the management device 80 is a general-purpose computer, and includes a CPU 81, a ROM 82, an HDD 83, a RAM 84, and an input and output interface 85. These are electrically connected to each other via a bus 86. An input signal is input to the management device 80 from an input device 87 such as a mouse and a keyboard via the input/output interface 85. An image signal is input to a display 88 from the management device 80 via the input and output interface 85. The HDD 83 stores a production plan of the board S. Here, the production plan of the board S means a plan for determining how each component mounting machine 10 mounts the component P on the board S in any order or how many sheets of the boards S having the mounted component P are to be produced. FIG. 5 is a view for describing an example of the production plan stored in the HDD 83. As illustrated in FIG. 5, the production plan includes a type of production lanes, the number of the boards S to be produced, component information relating to the component P to be mounted on the board S, feeder information relating to the feeder 18 to be used, head information relating to the head 50 to be used, and nozzle information relating to the suction nozzle 51 to be used. These information pieces are stored in the HDD 83 by being associated with production numbers. Here, the feeder information includes an installation position of the respective feeders 18 and a type of the component P supplied by the respective feeders 18. In addition, the nozzle information includes a type (nozzle diameter) of the suction nozzle 51 accommodated in the respective sockets 62 on the nozzle station 60 and information relating to which lane to be used, which nozzle holder 52 to be used for mounting, or which order to be used. This production plan is input to the management device 80 by a worker operating the input device 87. The management device 80 outputs a command signal to the component mounting machine 10 so that the component P is mounted on the board S in accordance with the production plan.

Figure 6:
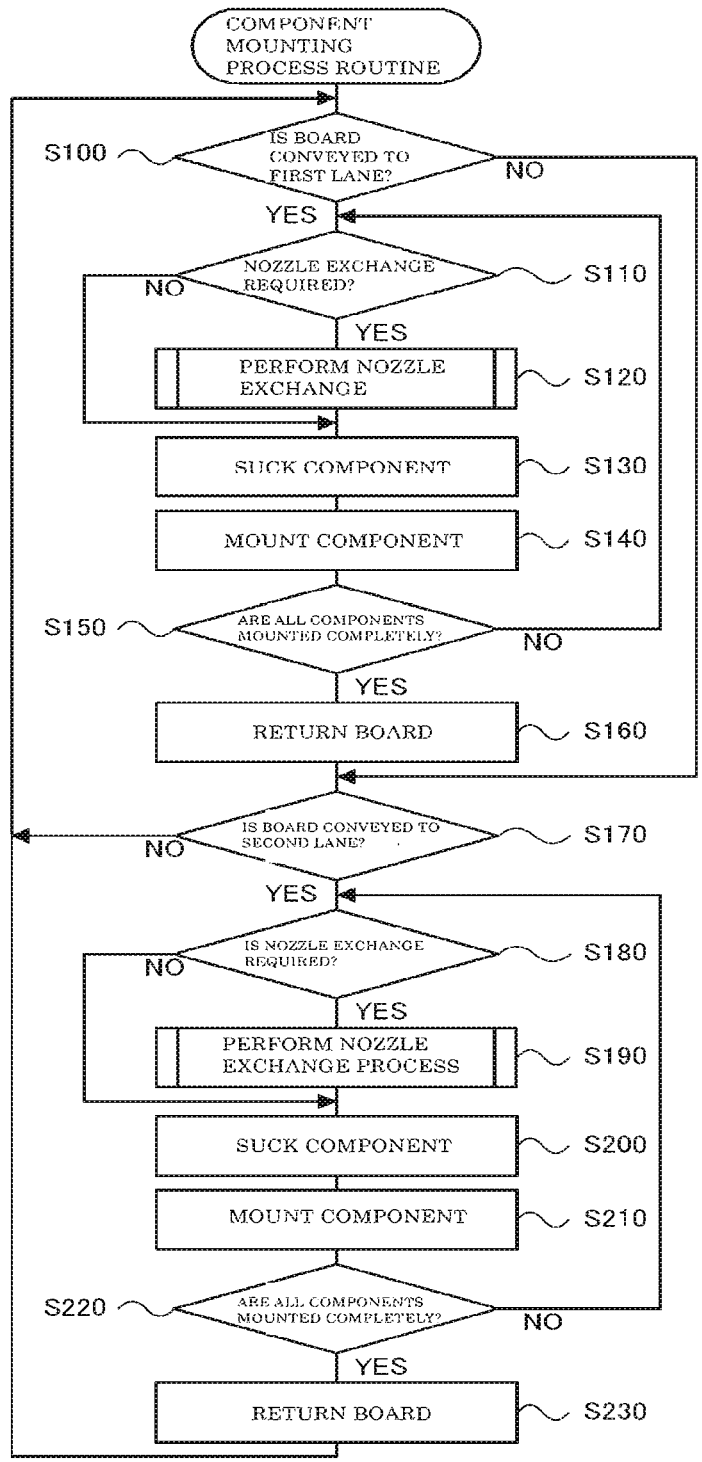
FIG. 6 is a flowchart illustrating an example of a component mounting process routine performed by the control device 70 of the component mounting machine 10.
Figure 7A:
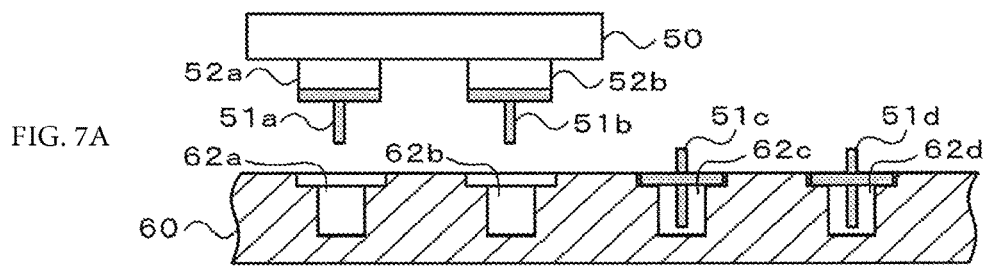
FIG. 7 is a view for describing a nozzle exchange state.
Figure 7B:
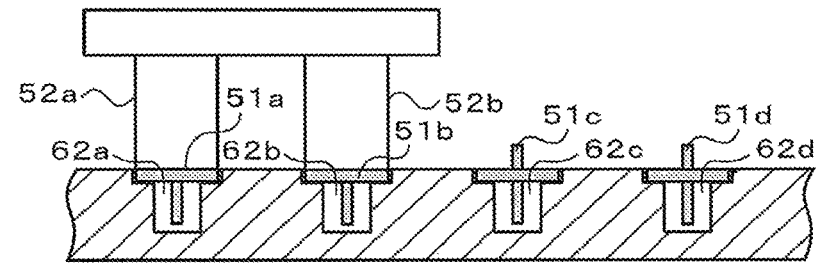
Figure 7C:
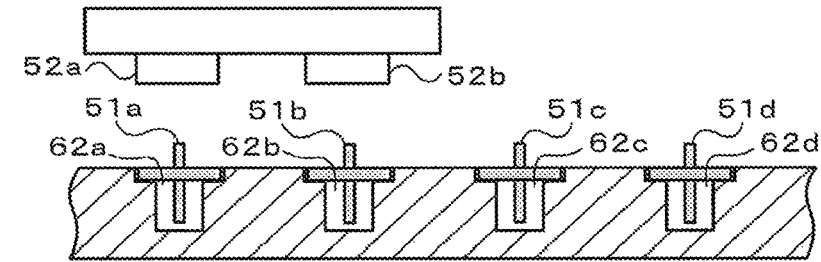
Figure 7D:
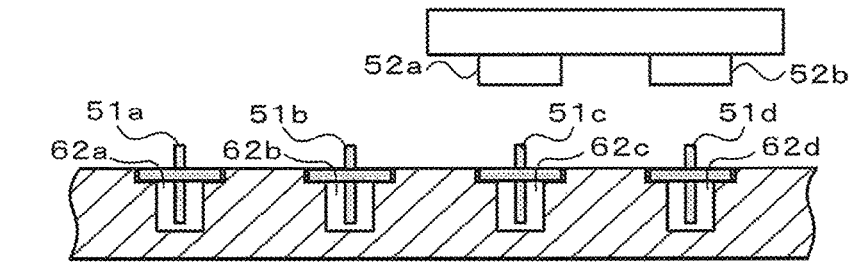
Figure 7E:
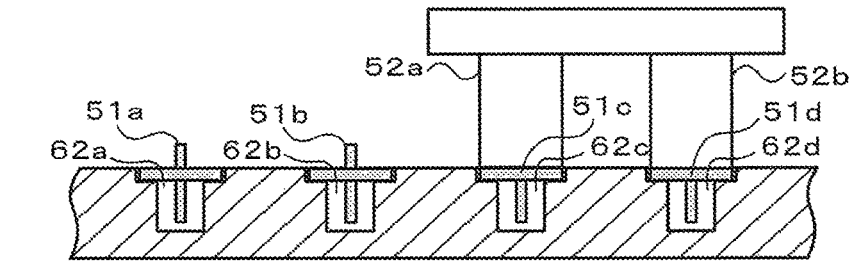
Figure 7F:
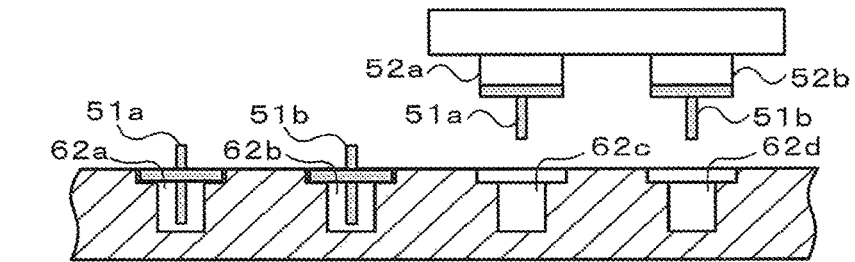

Next, an operation of the component mounting machine 10 according to the present embodiment configured in this way will be described. FIG. 6 is a flowchart illustrating an example of a component mounting process routine performed by the CPU 71 of the control device 70. This routine is performed when a command signal is received from the management device 80.

If the component mounting process routine is performed, the CPU 71 of the control device 70 first determines whether or not the board S is conveyed to above the first lane 22a (Step S100). Here, if the board S is conveyed to the first lane 22a, the board S is positioned by the back-up device 30. If the CPU 71 determines that the board S is not conveyed, the process proceeds to a process in Step S170. On the other hand, if the CPU 71 determines that the board S is conveyed, the CPU 71 determines whether or not exchange of the suction nozzle 51 (nozzle exchange) is required (Step S110). The determination in Step S110 is made based on the nozzle information included in the production plan received from the management device 80. If the CPU 71 determines that the nozzle exchange is required, the CPU 71 performs a nozzle exchange process (Step S120). If the CPU 71 determines that the nozzle exchange is not required, the CPU 71 skips the process in Step S120. FIG. 7 is a view for describing a state where the suction nozzles to be mounted on the nozzle holders 52a and 52b are exchanged from suction nozzles 51a and 51b to suction nozzles 51c and 51d. In the drawing, "a to d" of respective sockets 62a to 62d represent the reference numerals given for convenience in order to distinguish the respective sockets from each other, and "a to d" of the respective suction nozzle 51a to 51d represent the reference numerals given for convenience in order to distinguish the respective suction nozzles from each other. The nozzle exchange is performed as follows. That is, the CPU 71 first controls the XY robot 40 (the X-axis actuator 42b and the Y-axis actuator 44b) so as to move the head 50 until the suction nozzles 51a and 51b currently mounted on the respective nozzle holders 52a and 52b arrive at positions facing the sockets 62a and 62b which are accommodation destinations of the suction nozzles 51a and 51b (refer to FIG. 7A). Subsequently, the CPU 71 controls the respective Z-axis actuators 54a and 54b so that the respective nozzle holders 52a and 52b are lowered, and releases the suction nozzles 51a and 51b held by the respective nozzle holders 52a and 52b, thereby simultaneously returning the suction nozzles 51a and 51b to the respective sockets 62a and 62b (refer to FIG. 7B). Then, the CPU 71 controls the Z-axis actuators 54a and 54b so that the respective nozzle holders 52a and 52b are lifted up (refer to FIG. 7C), and controls the XY robot 40 so as to move the head 50 until the nozzle holders 52a and 52b arrive at positions facing the sockets 62c and 62d respectively accommodating the suction nozzles 51c and 51d to be used for exchange (refer to FIG. 7D). If the nozzle holders 52a and 52b move to the positions facing the sockets 62c and 62d, the CPU 71 controls the Z-axis actuators 54a and 54b so that the nozzle holders 52a and 52b are lowered. The CPU 71 mounts the suction nozzles 51c and 51d respectively accommodated in the sockets 62c and 62d on the nozzle holders 52a and 52b (refer to FIG. 7E), and controls the Z-axis actuators 54a and 54b so that the nozzle holders 52a and 52b are lifted up (refer to FIG. 7F).

Next, the CPU 71 causes the suction nozzles 51 respectively mounted on the nozzle holders 52a and 52b to suck the component P supplied from the feeder 18 (Step S130). This process device a process for causing the respective two suction nozzles 51a and 51b to simultaneously suck the components P supplied from the two right and left adjacent feeders 18, in a case where the suction nozzles 51a and 51b are respectively mounted on the two right and left nozzle holders 52a and 52b. Specifically, the CPU 71 controls the XY robot 40 so that the two suction nozzles 51a and 51b arrive immediately above the respective components P supplied by the two target feeders 18. Then, the CPU 71 controls the Z-axis actuators 54a and 54b so that the nozzle holders 52a and 52b are lowered until the suction ports of the two suction nozzles 51a and 51b come into contact with the two components P which are located immediately below the suction ports. The CPU 71 controls the electromagnetic valves 59a and 59b so as to apply negative pressure to the suction ports of the two suction nozzles 51a and 51b, and causes the two suction nozzles 51a and 51b to simultaneously suck the components P.

If the component P is sucked by the suction nozzle 51 in this way, the CPU 71 moves the sucked component P onto the board S, and mounts the component P on a mounting position of the board S (Step S140). Specifically, a process in Step S140 is performed as follows. That is, in a case where the suction nozzles 51a and 51b are respectively mounted on the two nozzle holders 52a and 52b, the CPU 71 controls the XY robot 40 so that the component P sucked by the suction nozzle 51a arrives immediately above the mounting position of the board S. Then, the CPU 71 controls the first Z-axis actuator 54a so that the suction nozzle 51a is lowered until the component P is pressed against the mounting position. The CPU 71 controls the first electromagnetic valve 59a so as to apply positive pressure to the suction port of the suction nozzle 51a, thereby mounting the component P sucked by the suction nozzle 51a on the board S. Next, the CPU 71 controls the XY robot 40 so that the component P sucked by the suction nozzle 51b arrives immediately above the mounting position. Then, the CPU 71 controls the second Z-axis actuator 54b so that the suction nozzle 51b is lowered until the component P is pressed against the mounting position. The CPU 71 controls the second electromagnetic valve 59b so as to apply positive pressure to the suction port of the suction nozzle 51b, thereby mounting the component P sucked by the suction nozzle 51b on the board S. In the above-described example, after the CPU 71 first mounts the component P sucked by the suction nozzle 51a, the CPU 71 mounts the component P sucked by the suction nozzle 51b. However, after the CPU 71 first mounts the component P sucked by the suction nozzle 51b, the CPU 71 may mount the component P sucked by the suction nozzle 51a. Prior to the mounting of the components P sucked by the suction nozzles 51a and 51b, the CPU 71 moves the components P to above the parts camera 48 so as to be imaged by the parts camera 48. Based on the obtained image, the CPU 71 determines whether or not the components P are normally sucked by the suction nozzles 51a and 51b, and corrects the mounting position, based on the determination result.

If the components P are mounted in this way, the CPU 71 determines whether or not all of the components P to be mounted by the component mounting machine 10 are completely mounted on the board S (Step S150). If the CPU 71 determines that all of the components P are not completely mounted, the process returns to Step S110. If necessary, the CPU 71 performs the nozzle exchange process, and repeatedly performs the mounting operation in Steps S120 to S140. If the CPU 71 determines that all of the components P are completely mounted, the CPU 71 controls the board conveyance device 20, thereby returning the board S (Step S160). The process proceeds to a subsequent process in Step S170.

Next, the CPU 71 determines whether or not the board S is conveyed onto the second lane 22b (Step S170). If the CPU 71 determines that the board S is not conveyed, the process returns to the process in Step S100. If the CPU 71 determines that the board S is conveyed, the CPU 71 carries out the nozzle exchange work in accordance with a type of the component P to be mounted. Thereafter, the CPU 71 simultaneously sucks the two components P, and performs the mounting operation for mounting the two components P on the respectively corresponding mounting positions. If the mounting operation is completed, the mounting operation for returning the board S is performed (Steps S180 to S230). The processes in Steps S180 to S230 are the same as the processes in Steps S110 to S160 except that target lanes are different from each other, and thus, detailed description thereof will be omitted.

Figure 8:
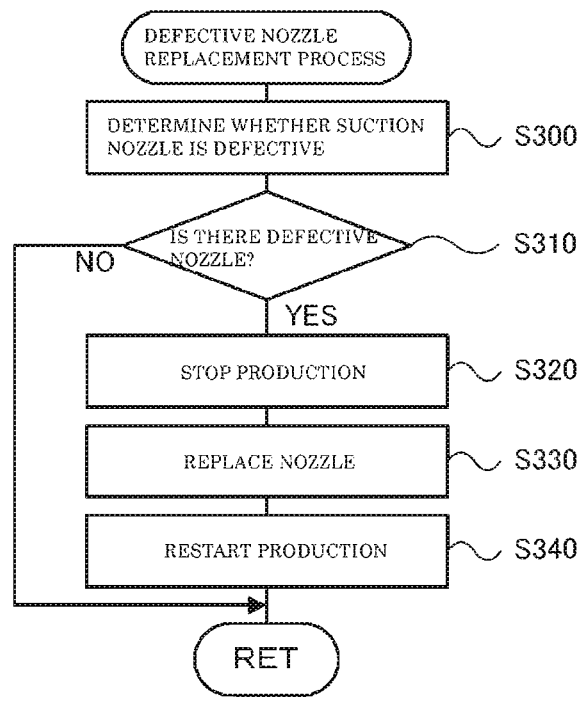
FIG. 8 is a flowchart illustrating an example of defective nozzle replacement process performed by the control device 70 of the component mounting machine 10.

FIG. 8 is a flowchart illustrating an example of defective nozzle replacement process performed by the CPU 71 of the control device 70. This process is repeatedly performed every predetermined time. If the defective nozzle replacement process is performed, the CPU 71 first determines abnormality of the suction nozzle accommodated on the nozzle station 60 and the suction nozzle mounted on the respective nozzle holders 52a and 52b (Step S300). Here, for example, cases where the CPU 71 determines the abnormality of the suction nozzle can include a case where an error occurs that the identification code cannot be identified when the type of the suction nozzle is specified by causing the mark camera 46 to image the identification code provided for the suction nozzle 51 on the nozzle station 60 when the production starts, a case where bending or absence of the suction nozzle 51 is detected based on an image obtained by causing the parts camera 48 to image the suction nozzles 51 mounted on the nozzle holder 52a and 52b when the production starts, a case where it is detected that the component P is returned without being mounted on the board S, based on an image obtained by causing the parts camera 48 to image the suction nozzle 51 after the component P is mounted on the board S, a case where the component P sucked by the suction nozzle 51 is defectively sucked predetermined times or more frequently during the production, and a case where nozzle clogging is detected by a vacuum sensor (not illustrated) for detecting vacuum pressure or a vacuum flow rate of the nozzle holders 52a and 52b (internal passages 53a and 53b) during the production. If the CPU 71 determines that any of the determination target suction nozzles is not abnormal, the CPU 71 completes the defective nozzle replacement process.

Figure 9:
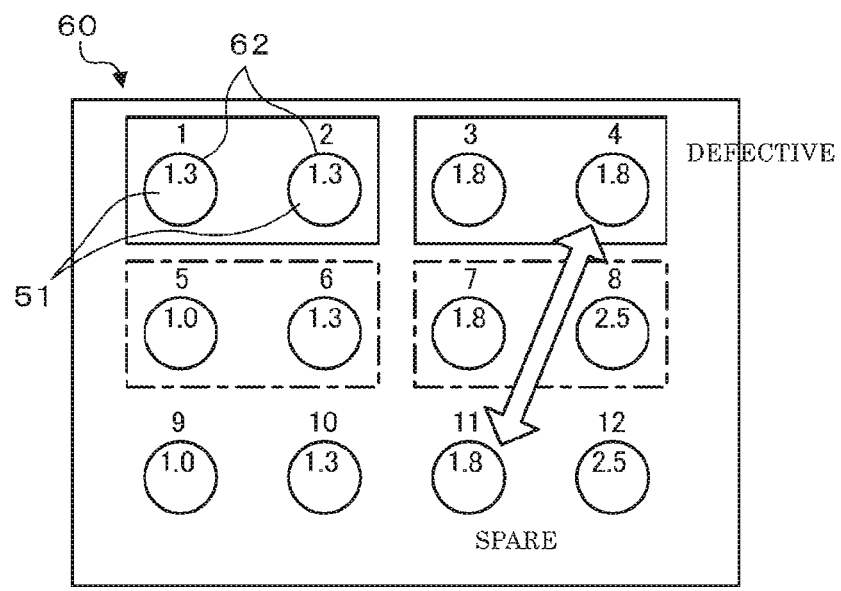
FIG. 9 is a view for describing a replacement origin accommodation destination and a replacement destination accommodation destination when a defective nozzle appears.

On the other hand, if the CPU 71 determines that any one of the determination target suction nozzles is abnormal (a defective nozzle appears), the CPU 71 stops the production (Step S320), and performs the nozzle replacement process for replacing the defective nozzle with a spare nozzle (Step S330). Thereafter, the CPU 71 restarts the production (Step S340), and completes the defective nozzle replacement process. Here, as illustrated in FIG. 9, the defective nozzle replacement process is to replace an accommodation destination (fourth socket) of the defective nozzle and an accommodation destination (eleventh socket) of the spare nozzle having the same type (nozzle diameter) as that of the defective nozzle with each other. FIGS. 10 and 11 are views for describing a state where the suction nozzle 51a (defective nozzle) accommodated in the socket 62a is replaced with the suction nozzle 51d (spare nozzle) accommodated in the socket 62d. The nozzle replacement process is performed as follows. That is, as illustrated, the CPU 71 first controls the XY robot 40 so that the head 50 is moved until the first nozzle holder 52a arrives at a position facing the socket 62a which is the accommodation destination of the defective nozzle (refer to FIG. 10A). Subsequently, the CPU 71 controls the first Z-axis actuator 54a so that the first nozzle holder 52a is lowered, and the first nozzle holder 52a holds the suction nozzle 51a (defective nozzle), thereby mounting the suction nozzle 51a (defective nozzle) on the first nozzle holder 52a (refer to FIG. 10B). Then, the CPU 71 controls the first Z-axis actuator 54a so that the first nozzle holder 52a is lifted up (refer to FIG. 10C). The CPU 71 controls the XY robot 40 so that the head 50 is moved until the second nozzle holder 52b arrives at a position facing the socket 62d accommodating the suction nozzle 51d (spare nozzle) serving as a replacement origin (refer to FIG. 10D). If the second nozzle holder 52b moves to the position facing the socket 62d, the CPU 71 controls the second Z-axis actuator 54b so that the second nozzle holder 52b is lowered, and the second nozzle holder 52b holds the suction nozzle 51d (spare nozzle), thereby mounting the suction nozzle 51d (spare nozzle) on the second nozzle holder 52b (refer to FIG. 10E). Thereafter, the CPU 71 controls the second Z-axis actuator 54b so that the second nozzle holder 52b is lifted up (refer to FIG. 10F). In this manner, the two nozzle holders 52a and 52b are brought into a state where both the suction nozzle 51a (defective nozzle) and the suction nozzle 51d (spare nozzle) are mounted thereon.

Figure 11G:
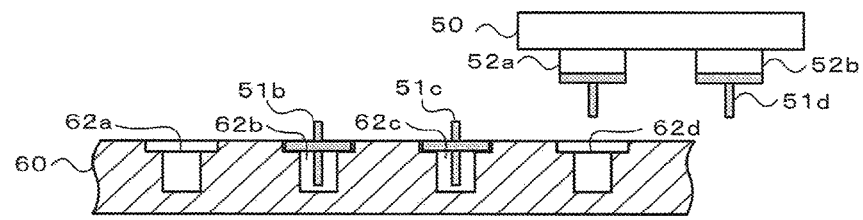
FIG. 11 is a view for describing a nozzle replacement state (last half).
Figure 11H:
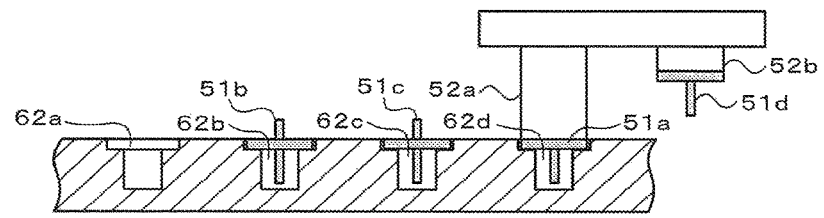
Figure 11I:
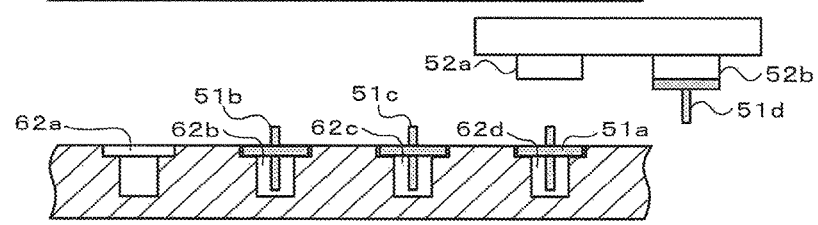
Figure 11J:
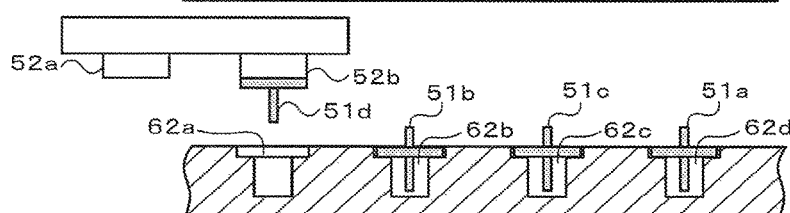
Figure 11K:
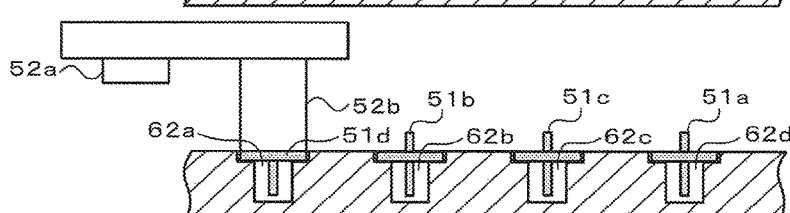
Figure 11L:
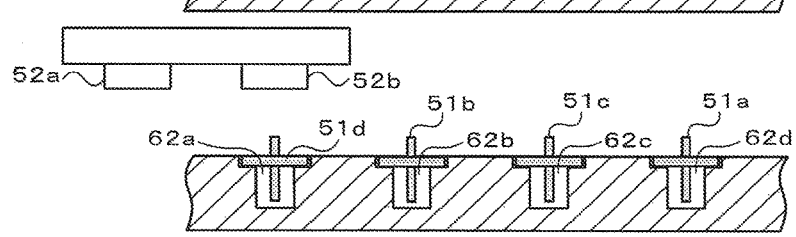

Next, the CPU 71 controls the XY robot 40 so that the head 50 is moved until the first nozzle holder 52a having the suction nozzle 51a (defective nozzle) mounted thereon arrives at a position facing the socket 62d which is in an empty state where the suction nozzle 51d (spare nozzle) is taken out (refer to FIG. 11G). The CPU 71 controls the first Z-axis actuator 54a so that the first nozzle holder 52a is lowered, and releases the suction nozzle 51a (defective nozzle) held by the first nozzle holder 52a, thereby causing the socket 62d to accommodate the suction nozzle 51a (defective nozzle) (refer to FIG. 11H). Then, the CPU 71 controls the first Z-axis actuator 54a so that the first nozzle holder 52a is lifted up (refer to FIG. 11I). The CPU 71 controls the XY robot 40 so that the head 50 is moved until the second nozzle holder 52b having the suction nozzle 51d (spare nozzle) mounted thereon arrives at a position facing the socket 62a which is in an empty state where the suction nozzle 51a (defective nozzle) is taken out (refer to FIG. 11J). The CPU 71 controls the second Z-axis actuator 54b so that the second nozzle holder 52b is lowered, and releases the suction nozzle 51d (spare nozzle) held by the second nozzle holder 52b, thereby causing the socket 62a to accommodate the suction nozzle 51d (spare nozzle) (refer to FIG. 11K). If the suction nozzle 51d (spare nozzle) is accommodated in the socket 62a, the CPU 71 controls the second Z-axis actuator 54b so that the second nozzle holder 52b is lifted up (refer to FIG. 11L), thereby completing the nozzle replacement process. In the nozzle replacement process, the suction nozzle 51a accommodated in the socket 62a serving as the replacement destination is mounted thereon earlier, and the suction nozzle 51d accommodated in the socket 62d serving as the replacement origin is mounted thereon later. However, the mounting order may be reversed. In this way, the nozzle replacement process is performed through a state where the two replacement target suction nozzles 51a and 51d are simultaneously mounted on both the two nozzle holders 52a and 52b. Accordingly, even in a state where the socket 62 is not empty, the two suction nozzles 51a and 51d can be automatically replaced.

Figure 12:
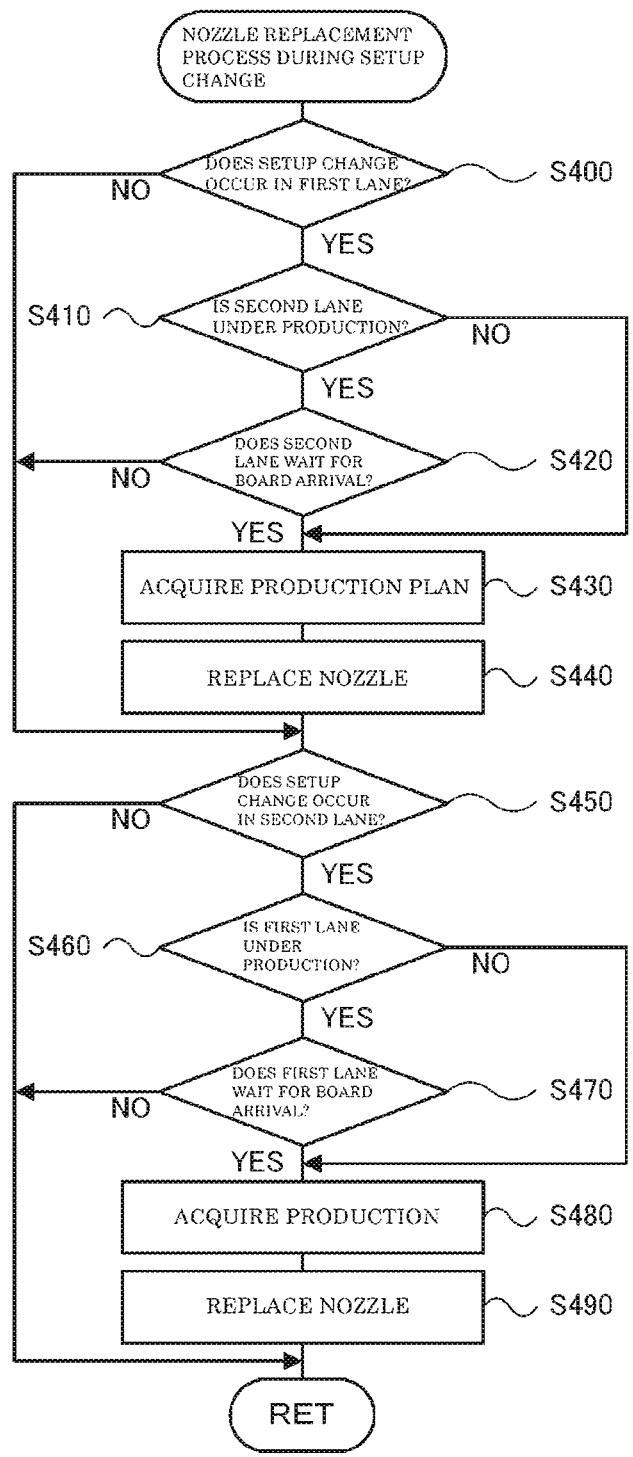
FIG. 12 is a flowchart illustrating an example of a nozzle replacement process during setup change performed by the control device 70 of the component mounting machine 10.

FIG. 12 is a flowchart illustrating an example of the nozzle replacement process during setup change performed by the CPU 71 of the control device 70. This process is repeatedly performed every predetermined time. If the nozzle replacement process is performed during the setup change, the CPU 71 first determines whether or not the production in the first lane 22a is completed and the setup change occurs (Step S400). If the CPU 71 determines that the setup change does not occur in the first lane 22a, the process proceeds to a process in Step S450. If the CPU 71 determines that the setup change occurs in the first lane 22a, the CPU 71 determines whether or not a state of the second lane 22b is under production (Step S410). If the state is under production, the CPU 71 determines whether or not the second lane 22b is in a board conveyance standby state (Step S420). If the CPU 71 determines that the state of the second lane 22b is not under production, or if the CPU 71 determines that the second lane 22b is in the board conveyance standby state even when the second lane 22b is under production, the CPU 71 acquires a production plan relating to the subsequent production for the first lane 22a from the management device 80 (Step S430), and performs the nozzle replacement process in accordance with the acquired production plan (Step S440).

In addition, the CPU 71 determines whether or not the production in the second lane 22b is completed and the setup change occurs (Step S450). If the CPU 71 determines that the setup change does not occur in the second lane 22b, the nozzle replacement process is completed during the setup change. If the CPU 71 determines that the setup change occurs in the second lane 22b, the CPU 71 determines whether or not a state of the first lane 22a is under production (Step S460). If the state is under production, the CPU 71 determines whether or not the first lane 22a is in a board conveyance standby state (Step S470). If the CPU 71 determines that the state of the first lane 22b is not under production, or if the CPU 71 determines that the first lane 22a is in the board conveyance standby state even when the first lane 22a is under production, the CPU 71 acquires a production plan relating to the subsequent production for the second lane 22b from the management device 80 (Step S480). The CPU 71 performs the nozzle replacement process in accordance with the acquired production plan (Step S490), and completes the nozzle replacement process during the setup change.

Figure 13:
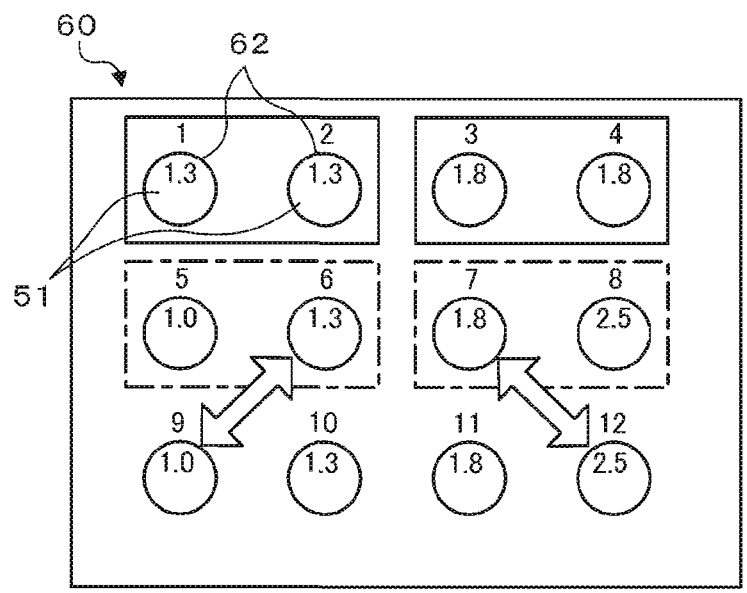
FIG. 13 is a view for describing a replacement origin accommodation destination and a replacement destination accommodation destination when the setup change occurs.

The nozzle replacement process during the setup change is a process in which a combination of the suction nozzles 51 used for the preceding production is substituted with a combination of the suction nozzles 51 used for the subsequent production. For example, as illustrated in FIG. 13, a case is conceivable where the preceding production in the second lane 22b needs to include the fifth to eighth sockets for respectively accommodating a nozzle having a nozzle diameter of 1.0 mm, a nozzle having a nozzle diameter of 1.3 mm, a nozzle having a nozzle diameter of 1.8 mm, and a nozzle having a nozzle diameter of 2.5 mm, and where the subsequent production in the second lane 22b needs to include the fifth to eighth sockets for respectively accommodating a nozzle having a nozzle diameter of 1.0 mm, a nozzle having a nozzle diameter of 1.0 mm, a nozzle having a nozzle diameter of 2.5 mm, and a nozzle having a nozzle diameter of 2.5 mm. In this case, the CPU 71 may perform a process in which the nozzle accommodated in the sixth socket and having the nozzle diameter of 1.3 mm is replaced with the spare nozzle accommodated in the ninth socket and having the nozzle diameter of 1.0 mm, and in which the nozzle accommodated in the seventh socket and having the nozzle diameter of 1.8 mm is replaced with the spare nozzle accommodated in the twelfth socket and having the nozzle diameter of 2.5 mm. In this case, the nozzle replacement process can be performed by performing the same process as the above-described defective nozzle replacement process.

The above-described component mounting machine 10 according to the present embodiment includes the nozzle station 60 having the multiple sockets 62 for accommodating the suction nozzles 51 at the same interval as the interval of the multiple nozzle holders 52a and 52b having the suction nozzles 51 detachable therefrom. The suction nozzles 51a and 51b mounted on the multiple nozzle holders 52a and 52b are respectively moved to the positions facing the sockets 62a and 62b serving as the accommodation destination. The suction nozzles 51a and 51b mounted on the multiple nozzle holders 52a and 52b are simultaneously returned to the respectively facing sockets 62a and 62b (simultaneous returning). The multiple nozzle holders 52a and 52b are respectively moved to the positions facing the sockets 62c and 62d accommodating a set of the suction nozzles 51c and 51d serving as the subsequent mounting target. The suction nozzles 51c and 51d serving as the mounting target accommodated in the respectively corresponding sockets 62c and 62d are simultaneously mounted on the multiple nozzle holders 52a and 52b (simultaneous mounting). In this manner, compared to a case where the suction nozzle exchange work is individually carried out for each of the nozzle holders 52a and 52b, it is possible to improve efficiency of the exchange work. In addition, in the component mounting machine 10 according to the present embodiment, one nozzle holder 52b of the nozzle holders 52a and 52b is moved to the position facing the socket 62d serving as the replacement origin. The suction nozzle Old accommodated in the facing socket 62d serving as the replacement origin is mounted on one nozzle holder 52b. The suction nozzle 51d mounted on one nozzle holder 52b is moved to the position facing the socket 62a serving as the replacement destination, and the suction nozzle 51d mounted on one nozzle holder 52b is accommodated in the socket 62a serving as the replacement destination, thereby automatically performing the nozzle replacement process. That is, the nozzle replacement process can automatically change a combination of the suction nozzles which can be simultaneously mounted on the multiple nozzle holders 52a and 52b, if necessary. As a result, the suction nozzle exchange work can be efficiently carried out, and it is possible to prevent poor production efficiency.

In addition, in the component mounting machine 10 according to the present embodiment, the nozzle replacement process is performed through a state where the two replacement target suction nozzles 51a and 51d are simultaneously mounted on both the two nozzle holders 52a and 52b. Accordingly, even in a state where the socket 62 is not empty, the two suction nozzles 51a and 51d can be automatically replaced, and the nozzle replacement can be quickly performed.

In addition, in the component mounting machine 10 according to the present embodiment, the nozzle replacement process is performed in a case where the defective nozzle appears. Accordingly, even in a case where the defective nozzle appears during the production, the component mounting machine 10 can be automatically restored. Furthermore, in the component mounting machine 10 according to the present embodiment, in a case where one lane of the first lane 22a and the second lane 22b is under production and the setup change occurs in the other lane, the board conveyance standby state (free time) in one lane under production is utilized so as to replace the suction nozzle 51 to be used for the subsequent production in the other lane, and therefore the setup change can be automatically performed for the subsequent production type in the other lane while the production in the one lane is continuously performed.

In the component mounting machine 10 according to the present embodiment, the nozzle replacement process is performed through a state where the two replacement target suction nozzles 51a and 51d are simultaneously mounted on both the two nozzle holders 52a and 52b. However, a configuration is not limited thereto. For example, the configuration may be adopted as follows. In a case where an empty socket is present in the nozzle station 60, the suction nozzle accommodated in the socket serving as the replacement destination is mounted on any one of the nozzle holders 52a and 52b, and is temporarily accommodated in the empty socket. The suction nozzle accommodated in the socket serving as the replacement origin is mounted on any one of the nozzle holders 52a and 52b, and is accommodated in the socket serving as the replacement destination. The suction nozzle accommodated in the empty socket is mounted on any one of the nozzle holders 52a and 52b, and is accommodated in the socket serving as the replacement origin. In this manner, the nozzle replacement may be performed. The suction nozzle accommodated in the socket serving as the replacement origin is mounted on any one of the nozzle holders 52a and 52b, and is temporarily accommodated in the empty socket. The suction nozzle accommodated in the socket serving as the replacement destination is mounted on any one of the nozzle holders 52a and 52b, and is accommodated in the socket serving as the replacement origin. The suction nozzle accommodated in the empty socket is mounted on any one of the nozzle holders 52a and 52b, and is accommodated in the socket serving as the replacement destination. In this manner, the nozzle replacement may be performed.

In the component mounting machine 10 according to the present embodiment, in a case where the setup change occurs in any one of the first lane 22a and the second lane 22b, when the other lane is under production, the nozzle replacement process is performed while the other lane is in the board conveyance standby state (free time). However, a configuration is not limited thereto. The nozzle replacement process may be performed by temporarily stopping the production in the other lane.

The component mounting machine 10 according to the present embodiment includes the two nozzle holders 52a and 52b, but may include three or more nozzle holders. In this case, the nozzle station 60 may have the multiple sockets arrayed so that the suction nozzles can be simultaneously mounted on the three or more nozzle holders.

Here, a correspondence relationship between main elements according to the present embodiment and main elements according to the disclosure disclosed in the Summary of the disclosure will be described. That is, the component mounting machine 10 corresponds to a "component mounting machine", the nozzle holders 52a and 52b correspond to "multiple holders", the XY robot 40 corresponds to "moving device", the Z-axis actuators 54a and 54b correspond to "lifting and lowering device", the nozzle station 60 corresponds to a "nozzle accommodation container", the CPU 71 of the control device 70 which performs the process in Step S120 or Step S190 in the component mounting process routine in FIG. 6 corresponds to "nozzle exchange control device", and the CPU 71 of the control device 70 which performs the process in Step S330 in the defective nozzle replacement process in FIG. 8 or the processes in Step S440 and Step S490 in the nozzle replacement process during the setup change in FIG. 12 corresponds to "nozzle replacement control device". In addition, the CPU 71 of the control device 70 which performs the process in Step S300 in the defective nozzle replacement process in FIG. 8 corresponds to "abnormality determination device".

The present disclosure is not limited to the above-described embodiment, and can be performed in various forms which are included within the technical scope of the present disclosure, as a matter of course.

INDUSTRIAL APPLICABILITY

The present invention can be utilized for manufacturing industries of a component mounting machine.

REFERENCE SIGNS LIST

10: component mounting machine, 11: base, 12: main body frame, 13: support table, 14: feeder table, 16: component supply device, 18: feeder, 20: board conveyance device, 22a: first lane, 22b: second lane, 24a, 24b: belt conveyor device, 30: back-up device, 32: back-up plate, 34: back-up pin, 40: XY robot, 41: X-axis guide rail, 42: X-axis slider, 42a: X-axis position sensor, 42b: X-axis actuator, 43: Y-axis guide rail, 44: Y-axis slider, 44a: Y-axis position sensor, 44b: Y-axis actuator, 46: mark camera, 48: parts camera, 50: head, 51, 51a to 51d: suction nozzle, 52a: first nozzle holder, 52b: second nozzle holder, 53a, 53b: internal passage, 54a first Z-axis actuator, 54b: second Z-axis actuator, 56a: first θ-axis actuator, 56b: second θ-axis actuator, 57: vacuum pump, 58: air pipe, 59a: first electromagnetic valve, 59b: second electromagnetic valve, 60: nozzle station, 62, 62a to 62d: socket, 70: control device, 71: CPU, 72: ROM, 73: HDD, 74 RAM, 75: input and output interface, 76: bus, 80: management device, 81: CPU, 82: ROM, 83: HDD, 84: RAM, 85: input/output interface, 86: bus, 87: input device, 88: display, s: board, p: component.

The invention claimed is:

1. A component mounting machine for mounting a component on a board, comprising:
    a head including multiple holders each of the holders including a suction nozzle detachably attached to the respective holder, the suction nozzle configured to mount the component on the board;
    a moving device operably connected to the head and configured to move the head;
    a lifting and lowering device coupled to the head to independently lift and lower the multiple holders;
    a nozzle accommodation container on a frame of the component mounting machine, the nozzle accommodation container including multiple accommodation sections configured to accommodate the suction nozzle;
    a control device operatively connected to the head and configured to
        control the moving device to move the suction nozzle mounted on the respective holders to a position facing an accommodation target accommodation section in the multiple accommodation sections, and
        control the lifting and lowering device to place the suction nozzle mounted on the respective holders in the accommodation target accommodation section, and
        control the moving device to move the multiple holders having no suction nozzle mounted thereon move to a position facing the accommodation section which accommodates a set of mounting target suction nozzles in the multiple accommodation sections,
        control the lifting and lowering device to mount the mounting target suction nozzles accommodated in facing accommodation section respectively and simultaneously on the multiple holders;
        control the moving device to move a predetermined holder of the multiple holders to a position facing a first accommodation section of the accommodation container that accommodates a first suction nozzle that satisfies a predetermined replacement condition;
        control the lifting and lowering device to mount the first suction nozzle accommodated in the first accommodation section on the predetermined holders;
        control the moving device to move the first suction nozzle mounted on the predetermined holder to a position facing a second accommodation section of the accommodation container; and
        control the lifting and lowering device to place the first suction nozzle mounted on the predetermined holder in the second accommodation section.

2. The component mounting machine according to claim 1, wherein the control unit is further configured to
    determine whether the first suction nozzle satisfies the predetermined replacement condition, and
    control the moving device and the lifting and lowering device to exchange the first suction nozzle with a spare suction nozzle accommodated in the accommodation section on the basis that the replacement condition is satisfied in a case where the control unit determines that the first suction nozzle is abnormal.

3. The component mounting machine according to claim 1, further comprising:
    a first lane and a second lane,
    wherein the component mounting machine simultaneously mounts components on a board conveyed on the first lane and mounts component on a board conveyed on the second lane, and wherein the control device is configured to control the moving device and the lifting and lowering device to exchange a set of the suction nozzles used for a subsequent production accommodated in the accommodation section, on the basis that the replacement condition is satisfied in a case where any one of the first lane and the second lane is under production and setup change for the subsequent production type is performed after another production is completed.

* * * * *